United States Patent [19]
Sun et al.

[11] Patent Number: 5,902,752
[45] Date of Patent: May 11, 1999

[54] ACTIVE LAYER MASK WITH DUMMY PATTERN

[75] Inventors: Shin-Wei Sun; Water Lur, both of Taipei City; Ming-Tzong Yang, Hsinchu City; Hong-Tsz Pan, Hsinchu Hsien, all of Taiwan

[73] Assignee: United Microelectronics Corporation, Hsinchu City, Taiwan

[21] Appl. No.: 08/648,618

[22] Filed: May 16, 1996

[51] Int. Cl.⁶ .................................................. H01L 21/283
[52] U.S. Cl. ............................................................ 437/195
[58] Field of Search ............................................. 437/695

[56] References Cited

U.S. PATENT DOCUMENTS 5,556,805  9/1996  Tanizawa et al. ...................... 437/195

*Primary Examiner*—Samuel Barts
*Attorney, Agent, or Firm*—Oppenheimer Wolff & Donnelly LLP

[57] ABSTRACT

A method of designing an active layer mask with a dummy pattern by computer aided design (CAD) in shallow trench isolation using chemical mechanical polishing (CMP) to achieve global planarization. In this method, an original mask is provided with an active region including a diffusion area pattern, a polysilicon area pattern and a well area pattern. The diffusion area pattern and the polysilicon area pattern are expanded by an area of dimension a and the well area pattern is extended inward and outward to an area of dimension b. The expanded diffusion, polysilicon and well areas form a first pattern area. The first pattern area is subtracted from the whole region to obtain a second pattern area. A third pattern area is obtained by performing an AND operation on a dummy array pattern and the second pattern area. Expanding the third pattern area to an area of dimension c, a fourth pattern area is obtained. Finally an active layer mask with a dummy pattern is obtained by performing an OR operation on the fourth pattern area and the diffusion area pattern.

6 Claims, 7 Drawing Sheets

ACTIVE LAYER MASK WITH DUMMY PATTERN

BACKGROUND OF THE INVENTION

1. Field of the Invention

This invention relates in general to an isolation process for integrated circuits and more particularly to a method of designing an active layer mask with a dummy pattern by computer aided design (CAD) using chemical mechanical polishing (CMP) in shallow trench isolation to achieve global planarization.

2. Description of Related Art

As integrated circuit designs become more complex and the line width used in the forming process is reduced to less than 1.0 μm, the development of trench isolation of the CMOS has its limitations. This is because shorter wavelengths of the light source in a photolithography process are needed for the feature size to obtain better resolution. However, its deficiency is the reduction of depth of focus. For example, when using deep ultra-violet ray of Krypton Fluoride laser (KrF laser) with a wavelength of 248 nm as a light source, to define CMOS elements with line width under 0.25 μm, a short depth of focus less than 0.8 μm is obtained. With this limitation, global planarization cannot be achieved by conventional trench isolation methods when the distances between active regions are too large. For chemical mechanical polishing process, if there is a region larger than 10 μm without an active region in the under layer, a disk-like recess will be formed at this region after polishing; thus, the conventional trench isolation method cannot meet the requirement of global planarization.

The conventional method of trench isolation is now described with reference to FIGS. 1A to 1D. As shown in FIG. 1A, a pad oxide layer 20 is formed on a semiconductor substrate 10. A dielectric layer 30, such as a silicon nitride layer, is formed on the pad oxide layer 20. Active regions 11, 12 and 13 are formed by photolithography and etching process. Using photoresist (not shown) on the active regions as a mask, a plurality of trenches are formed by anisotropically etching the substrate 10 to a predetermined depth. As shown in FIG. 1B, an oxide layer 40 is deposited on the substrate 10 by chemical vapor deposition (CVD). After that, the oxide layer 40 is polished by CMP, using the surface of the dielectric layer 30 as a stop layer, to form a plurality of trenches 14, 15 and 16 as shown in FIG. 1C. After removing the dielectric layer and forming a gate oxide layer 50 and a polysilicon layer 60, the trench isolation process is completed as shown in FIG. 1D.

Since trenches have different widths, for example trench 15 is much wider than trench 14, the polysilicon layer 80 will have a flat surface on trench 14, but a recessed surface on the trench 15. That is, only local planarization but not global planarization can be accomplished using the conventional technique.

SUMMARY OF THE INVENTION

It is therefore an object of the present invention to provide a method of designing an active layer mask with a dummy pattern by computer aided design (CAD) in shallow trench isolation using chemical mechanical polishing (CMP) to achieve global planarization.

The present invention achieves the above-identified object by providing an original mask whose active region includes a diffusion area pattern, a polysilicon area pattern and a well area pattern. The diffusion area pattern and the polysilicon area pattern are expanded to an area of dimension a and the well pattern is extended inward and outward to an area of dimension b. After expansion, the diffusion area pattern, the polysilicon area pattern and the well area pattern form a first pattern area. Subtracting the first pattern area from the active region results in a second pattern area. A dummy array pattern is provided. A third pattern area is obtained by performing an AND operation on the dummy array pattern and the second pattern area. Expanding the third pattern area to an area of dimension c, a fourth pattern area is obtained. Finally an active layer mask with a dummy pattern is obtained by performing an OR operation on the fourth pattern area and the diffusion area pattern.

BRIEF DESCRIPTION OF THE DRAWINGS

Other objects, features, and advantages of the present invention will become apparent by way of the following detailed description of the preferred but non-limiting embodiments. The description is made with reference to the accompanying drawings in which.

DETAILED DESCRIPTION OF THE PREFERRED EMBODIMENT

Figure 1A:
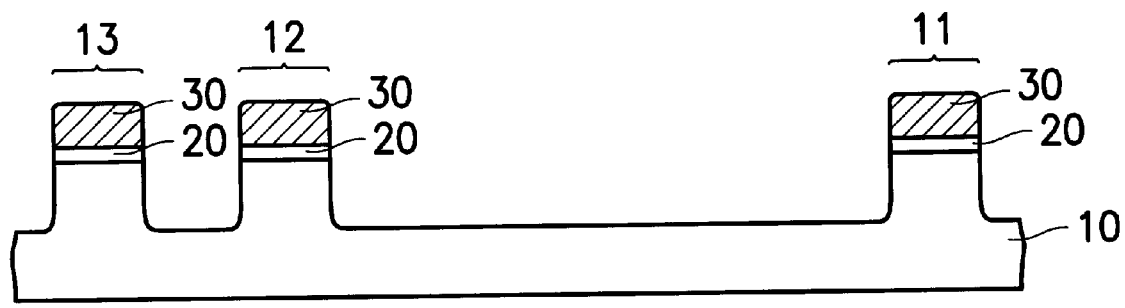
FIGS. 1A through 1D are cross-sectional diagrams illustrating the conventional process of shallow trench isolation by chemical mechanical polishing.
Figure 1B:
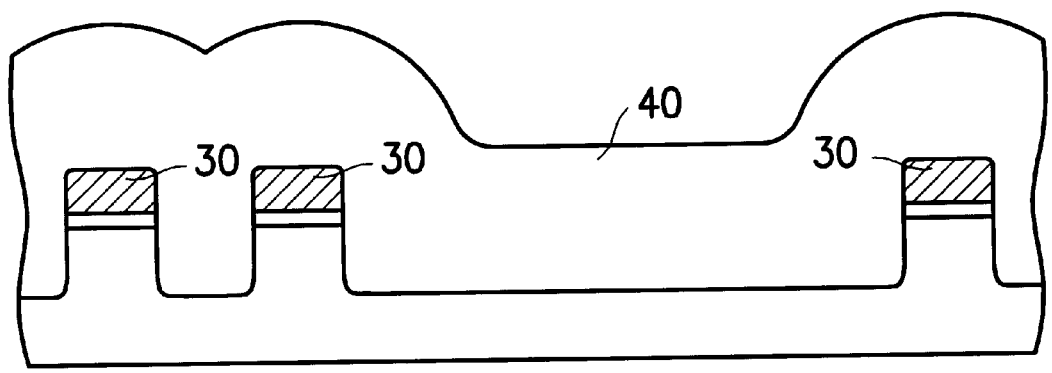
Figure 1C:
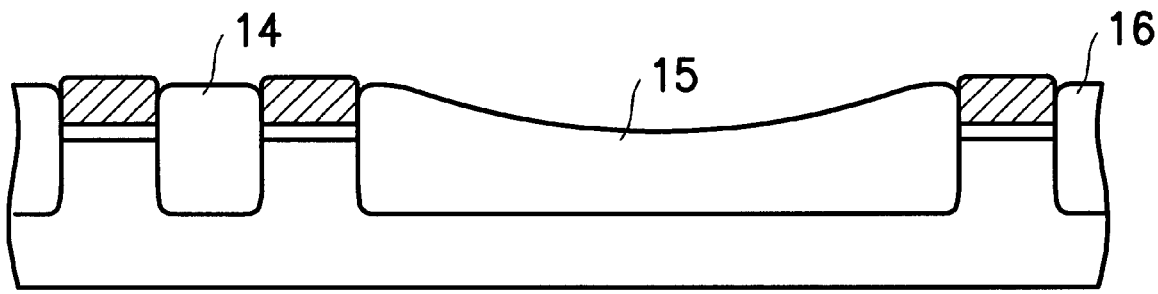
Figure 1D:
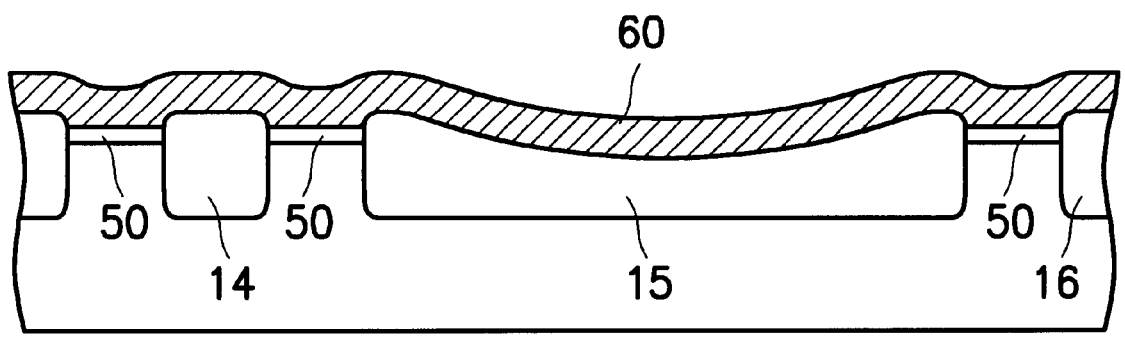
Figure 2A:
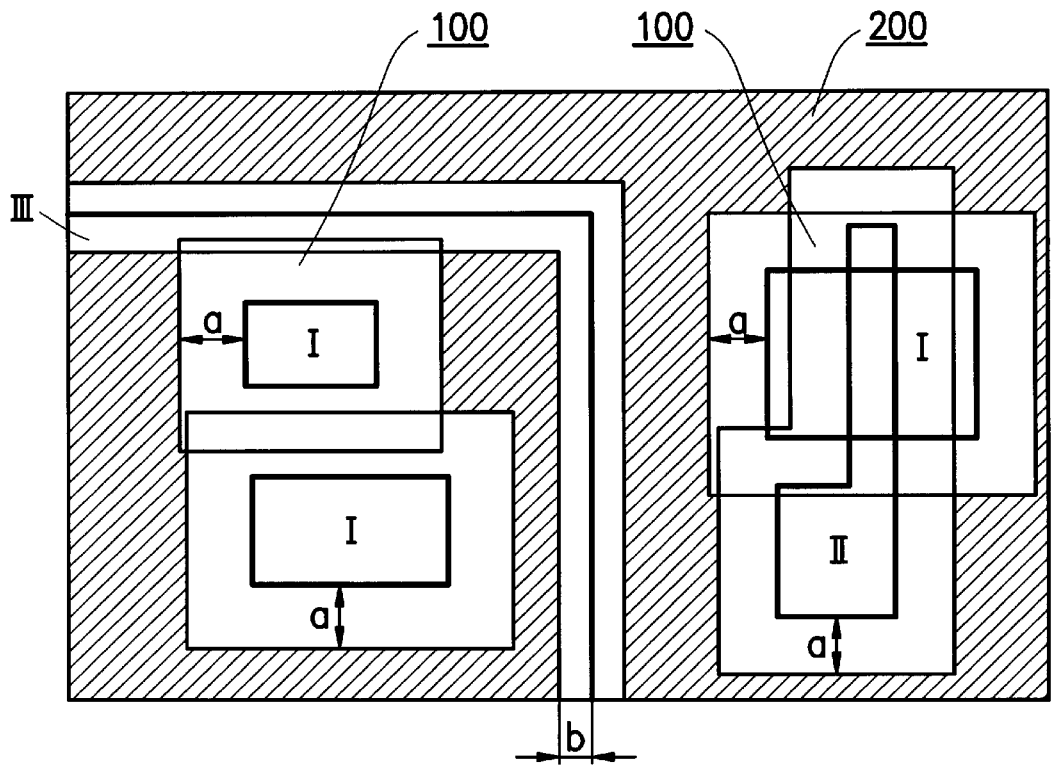
FIGS. 2A through 2E are top view diagrams illustrating the method of designing an active layer mask according to the present invention.

FIGS. 2A through 2E are top-view diagrams illustrating a method of designing an active layer mask with a dummy pattern according to the present invention. Referring to FIG. 2A, an active region includes a diffusion area pattern I, a polysilicon area pattern II and a well boundary area pattern III. At first, areas I and II are expanded by an area of dimension a. The preferred value of the dimension a can be 1.4 μm. The periphery of well is expanded inward and outward to form an area III with dimension 2b, and the preferred value of dimension b can be 0.9 μm. If the expanded areas overlap, the overlapped areas can be combined. After expansion, areas I, II and III form a first pattern area 100.

Figure 2B:
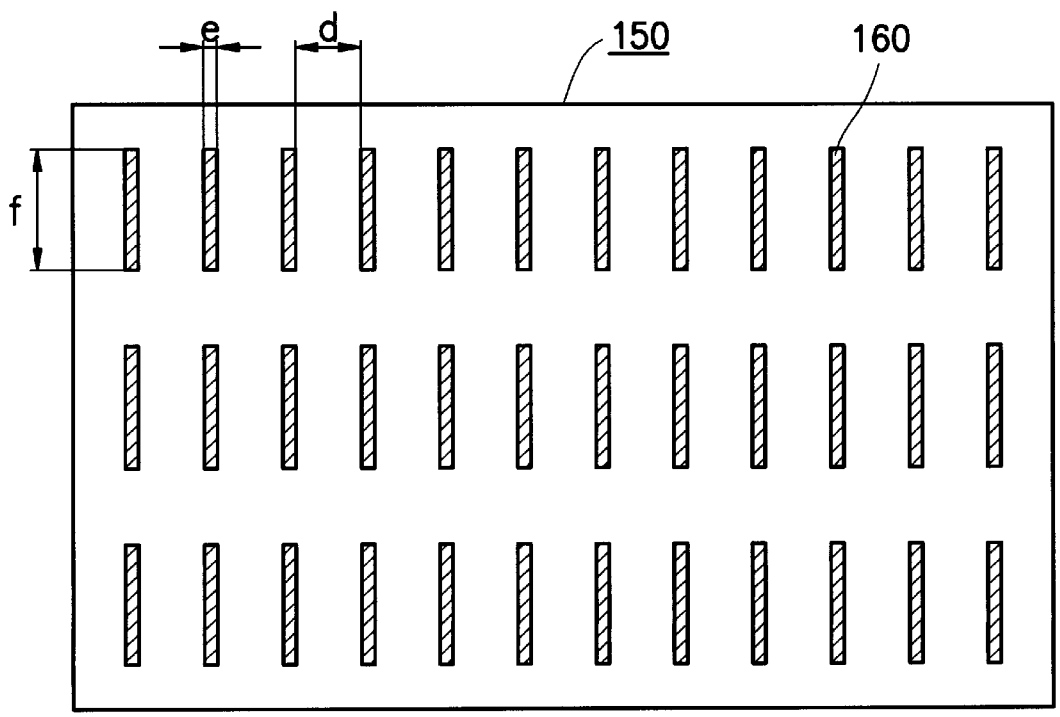

A second pattern area 200 is obtained by subtracting the first pattern area 100 from the whole region. This step can be achieved by reverse tone in this embodiment. Thereafter, as shown in FIG. 2B, a dummy array pattern 150 is provided. The dummy array pattern 150 includes a plurality of blocks 160 which have a width of dimension e and a length of dimension f. Each of the blocks is arranged in an array and displaced by a distance of dimension d. In one of the preferred embodiments, dimension d can be 1.8 μm, dimension e can be 0.2 μm and dimension can be 2.2 μm.

Figure 2C:
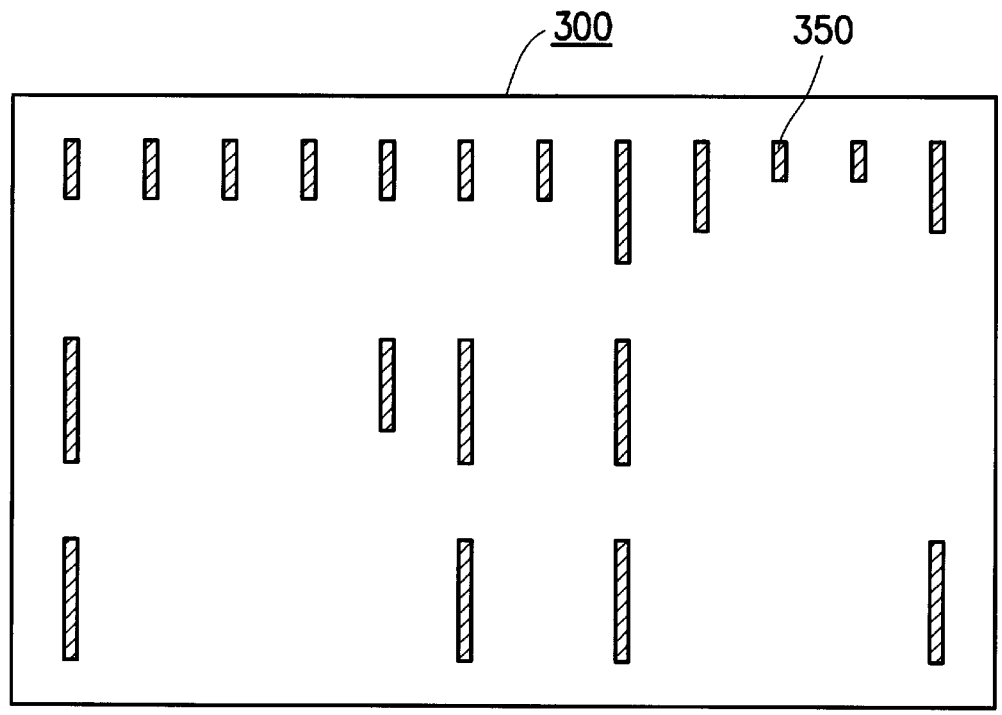
Figure 2D:
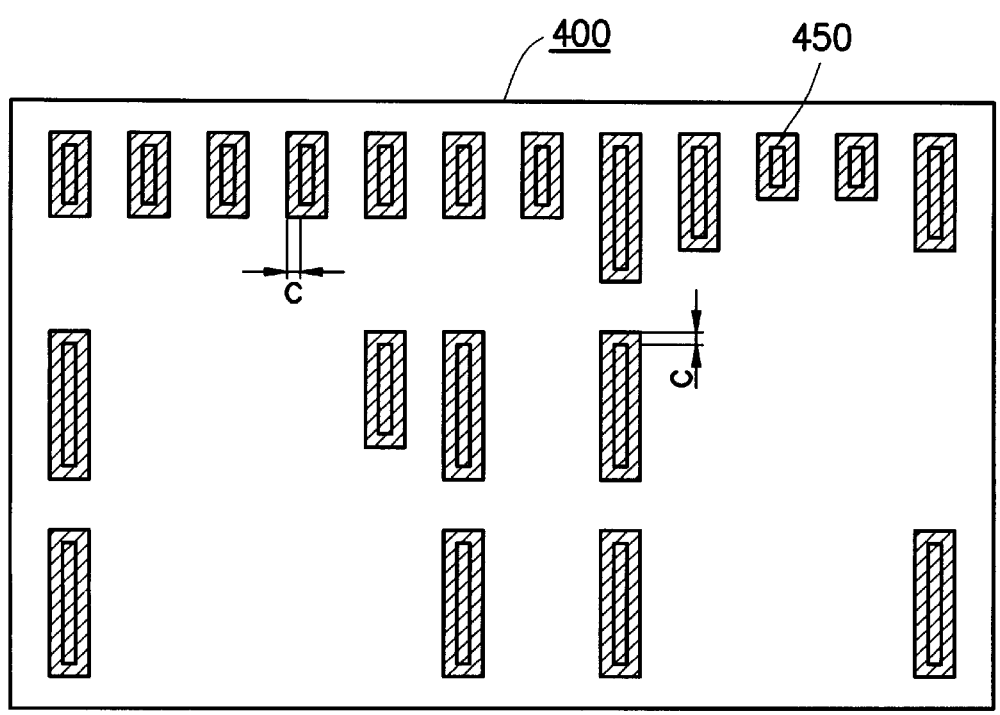

Referring to FIG. 2C, a third pattern area 300 is obtained by performing an AND operation on FIGS. 2A and 2B, that is, to provide the overlapping areas between the second pattern 200 and the dummy array pattern 150. The third pattern area 300 includes a plurality of blocks 350. Expanding each of the blocks 350 by an area of dimension c, a fourth pattern area 400 with a plurality of blocks 450 is obtained as shown in FIG. 2D. The preferred embodiment of the dimension c is 0.4 μm.

Figure 2E:
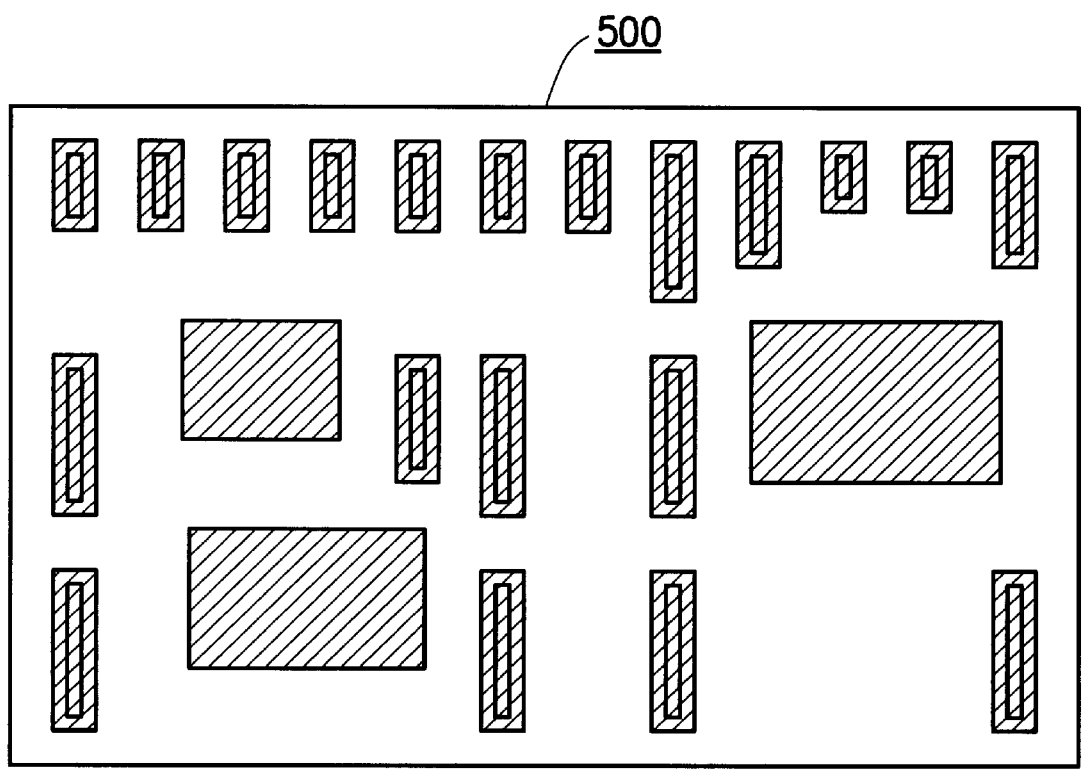

An active layer mask pattern 500 as shown in FIG. 2E is obtained by performing an OR operation on the fourth pattern area 400 in FIG. 2D and the diffusion area pattern I in FIG. 2A, that is, to add the diffusion area pattern I on the fourth pattern area 400. The active layer mask 500 with a dummy pattern is used in a shallow trench isolation process.

Figure 3A:
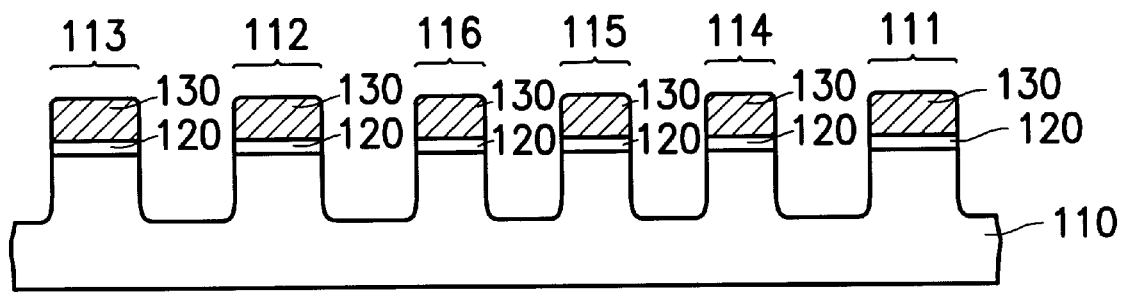
FIGS. 3A through 3D are cross-sectional diagrams illustrating the process of shallow trench isolation by chemical mechanical polishing according to the present invention.

FIGS. 3A through 3D are cross-sectional diagrams illustrating the process of shallow trench isolation by chemical mechanical polishing according to the present invention. Referring to FIG. 3A, a pad oxide layer 120 and a dielectric layer 130 are first deposited on a silicon substrate 110 and then coated with photoresist (not shown). Then, the active layer mask 500 with dummy pattern is used as a mask in a photolithography process to define the device areas 111, 112, 113 and the dummy device areas 114, 115, 116.

Figure 3B:
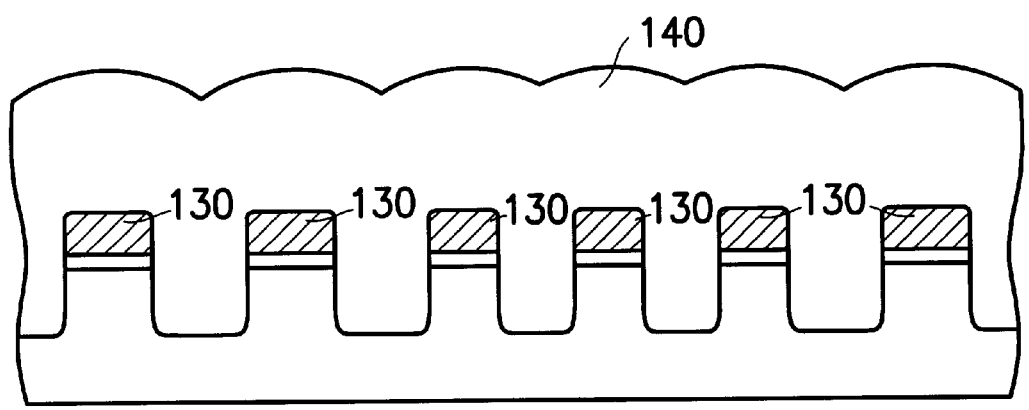
Figure 3C:
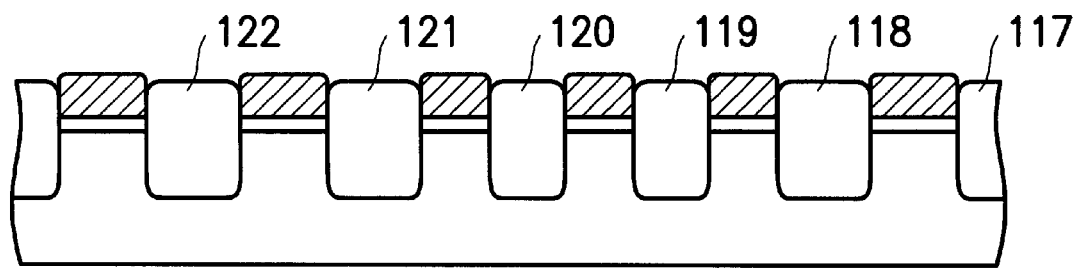
Figure 3D:
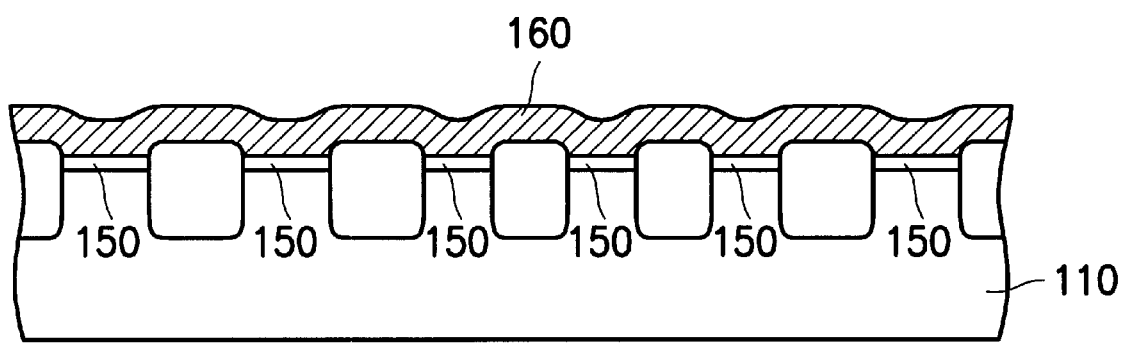

A plurality of trenches are formed on the surface of the silicon substrate 110 by anisotropic etching. An oxide layer 140 is deposited by chemical vapor deposition (CVD) as shown in FIG. 3B. Using the dielectric layer 130 as a stop layer, the oxide layer 140 is polished by chemical mechanical polishing (CMP) to form a plurality of trenches 117, 118, 119, 120, 121 and 122 as shown in FIG. 3C. The residual dielectric layer is then removed. A gate oxide layer 150 and a gate polysilicon layer 160 are formed on the substrate to complete the shallow trench isolation as shown in FIG. 3D.

According to the present invention, the integrated circuit with shallow trench isolation uses an active region pattern which is formed by a dummy array pattern, a diffusion area pattern, a polysilicon area pattern and a well area pattern to achieve global planarization. Since the calculations used in this process can be done by CAD, when the distances between devices are larger than the limitation of chemical mechanical polishing for global planarization, it can be reduced by adding further dummy devices to achieve global planarization.

In fact, the expanding parameters or dimensions of each pattern are independent but related to the pattern size, the design rule, and the characteristics of the device itself. In this embodiment, if the distance and the width of the dummy array block are both reduced to 1.0 $\mu$m, the minimum isolation width of the well area can be 1.0 $\mu$m, and the isolation width of the real active region and dummy active region can also be 1.0 $\mu$m. Such a pattern dimension is applicable to the light source using deep ultra-violet ray with wavelength of 248 nm, or other light sources with shorter wavelength in a photolithography process. Therefore, the present invention can fulfill the requirement of global planarization of an integrated circuit with 0.35 $\mu$m line width or even shorter.

While the invention has been described by way of example and in terms of a preferred embodiment, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A method of designing an active layer mask with dummy pattern, comprising the steps of:

(a) providing an original mask with active regions including a diffusion area pattern, a polysilicon area pattern and a well area pattern;

(b) expanding the diffusion area pattern and the polysilicon area pattern by an area of dimension a and expanding inward and outward by an area of dimension b to construct a first pattern area;

(c) subtracting the first pattern area from an area occupied by the original mask to obtain a second pattern area;

(d) providing a dummy array pattern and obtaining a third pattern area by performing an AND operation, in which an overlapping area between the dummy array pattern and the second pattern area is extracted;

(e) expanding the third pattern area by an area of dimension c to obtain a fourth pattern area; and (f) obtaining an active layer mask with a dummy pattern by performing an OR operation, in which the first diffusion pattern is added with the fourth area.

2. A method according to claim 1, wherein the dimension a is 1.4 $\mu$m.

3. A method according to claim 1, wherein the dimension b is 0.9 $\mu$m.

4. A method according to claim 1, wherein the dummy array pattern includes a plurality of blocks, each block having a width equal to 0.2 $\mu$m and a length equal to 2.2 $\mu$m with a distance equal to 1.8 $\mu$m.

5. A method according to claim 1, wherein the dimension c is 0.4 $\mu$m.

6. A method according to claim 1, wherein the dimensions a, b and c are 1.4 $\mu$m, 0.9 $\mu$m and 0.4 $\mu$m, respectively.

* * * * *

UNITED STATES PATENT AND TRADEMARK OFFICE
CERTIFICATE OF CORRECTION

PATENT NO.  : 5,902,752
DATED       : May 11, 1999
INVENTOR(S) : Sun et al.

It is certified that error appears in the above-indentified patent and that said Letters Patent is hereby corrected as shown below:

On the title page, item [75], should read

Inventors:   Shih-Wei Sun; Walter Lur, both of Taipei City; Ming-Tzong Yang, Hsinchu City; Hong-Tsz Pan, Hsinchu Hsien, all of Taiwan Signed and Sealed this Twenty-fifth Day of April, 2000

Attest:

Q. TODD DICKINSON

Attesting Officer        Director of Patents and Trademarks